(12) United States Patent
Jang

(10) Patent No.: US 11,805,607 B2
(45) Date of Patent: Oct. 31, 2023

(54) DISPLAY DEVICE

(71) Applicant: Samsung Display Co., Ltd., Yongin-si (KR)

(72) Inventor: Minsok Jang, Asan-si (KR)

(73) Assignee: Samsung Dispiay Co., Ltd., Yongin-si (KR)

( * ) Notice: Subject to any disclaimer, the term of this patent is extended or adjusted under 35 U.S.C. 154(b) by 3 days.

(21) Appl. No.: 17/451,442

(22) Filed: Oct. 19, 2021

(65) Prior Publication Data

US 2022/0256719 A1 Aug. 11, 2022

(30) Foreign Application Priority Data

Feb. 9, 2021 (KR) .................. 10-2021-0018639

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC .. H05K 5/0017; H05K 5/0217; G06F 1/1652; G06F 1/1626
See application file for complete search history.

(56) References Cited

U.S. PATENT DOCUMENTS

| | | | |
|---|---|---|---|
| 9,239,496 B2 * | 1/2016 | Ge | G02F 1/13394 |
| 9,280,176 B2 * | 3/2016 | Chong | G06F 1/1601 |
| 9,301,411 B2 | 3/2016 | Shin et al. | |
| 10,694,625 B2 | 6/2020 | Park et al. | |
| 2009/0174832 A1 * | 7/2009 | Lee | G06F 3/045 349/43 |
| 2011/0228190 A1 * | 9/2011 | Yang | G02F 1/13394 349/56 |
| 2012/0242610 A1 * | 9/2012 | Yasumatsu | H01L 27/323 345/173 |
| 2013/0050619 A1 * | 2/2013 | Kim | G02F 1/13394 430/320 |
| 2015/0192951 A1 * | 7/2015 | Chong | G02F 1/133305 359/894 |
| 2017/0150622 A1 * | 5/2017 | Kim | H05K 5/0017 |
| 2018/0210258 A1 * | 7/2018 | Tang | G02F 1/133305 |
| 2019/0165311 A1 | 5/2019 | Lee | |
| 2020/0089274 A1 * | 3/2020 | Kim | G06F 1/1652 |

(Continued)

FOREIGN PATENT DOCUMENTS

| | | |
|---|---|---|
| CN | 113516911 A | 10/2021 |
| EP | 3 893 474 A1 | 10/2021 |

(Continued)

*Primary Examiner* — Sagar Shrestha
(74) *Attorney, Agent, or Firm* — Lewis Roca Rothgerber Christie LLP

(57) ABSTRACT

Provided is a display device including a display module including a curvature area configured to be folded about an axis substantially parallel to a first direction, a first flat area, and a second flat area spaced from the first flat area in a second direction crossing the first direction with the curvature area therebetween, and a support member below the display module, and including a first plate, a second plate below the first plate, and a first spacer pattern between the first plate and the second plate, and including main spacers and sub spacers, the main spacers being longer than the sub spacers.

15 Claims, 10 Drawing Sheets

(56) References Cited

U.S. PATENT DOCUMENTS

| | | | |
|---|---|---|---|
| 2020/0221587 A1* | 7/2020 | An | H05K 5/0217 |
| 2020/0301221 A1* | 9/2020 | Sasanuma | G02F 1/1339 |
| 2021/0132259 A1* | 5/2021 | Wang | G06F 1/1601 |
| 2021/0165256 A1* | 6/2021 | Huang | G02F 1/136222 |
| 2021/0233438 A1* | 7/2021 | Mao | H04M 1/0266 |
| 2021/0319724 A1* | 10/2021 | Jang | G06F 1/1652 |

FOREIGN PATENT DOCUMENTS

| | | |
|---|---|---|
| KR | 10-2019-0049454 A | 5/2019 |
| KR | 10-2019-0064183 A | 6/2019 |
| KR | 10-2068565 B1 | 1/2020 |
| KR | 2021-0126175 A | 10/2021 |

\* cited by examiner

DISPLAY DEVICE

CROSS-REFERENCE TO RELATED APPLICATION

This application claims priority to, and the benefit of, Korean Patent Application No. 10-2021-0018639, filed on Feb. 9, 2021, the entire contents of which are hereby incorporated by reference.

BACKGROUND

1. Field

The present disclosure herein relates to a display device capable of diversely folding and sliding.

2. Description of Related Art

Display devices include a display area that is activated in response to electrical signals. Such a display device may sense an input applied from the outside through the display area and, at the same time, display various images to provide information to a user. Recently, as display devices having various shapes have been developed, display areas having various shapes have been embodied. For example, to facilitate portability and improve user's convenience, a display device has been recently developed, which is foldable, bendable, and rollable by including a flexible member to be curved.

SUMMARY

The present disclosure provides a display device capable of diversely folding and sliding while exhibiting excellent durability and improved strain.

Some embodiments of the present disclosure provide a display device including a display module including a curvature area configured to be folded about an axis substantially parallel to a first direction, a first flat area, and a second flat area spaced from the first flat area in a second direction crossing the first direction with the curvature area therebetween, and a support member below the display module, and including a first plate, a second plate below the first plate, and a first spacer pattern between the first plate and the second plate, and including a plurality of main spacers and a plurality of sub spacers, each of the main spacers being longer than each of the sub spacers.

The main spacers and the sub spacers may be alternately arranged in the second direction.

The main spacers and the sub spacers may be spaced apart from each other in the second direction.

The main spacers may contact the first plate and the second plate, wherein the sub spacers contact only one of the first plate or the second plate.

One of the sub spacers may contact the first plate, wherein a first inner space is defined between the one of the sub spacers and the second plate.

One of the sub spacers may contact the second plate, wherein a first inner space is defined between the one of the sub spacers and the first plate.

The support member may further include a second spacer pattern between the first plate and the second plate, and including only main spacers.

The first spacer pattern may overlap the first flat area and the second flat area, wherein the second spacer pattern overlaps the curvature area.

The first spacer pattern may overlap the curvature area, wherein the second spacer pattern overlaps the first flat area and the second flat area.

The first plate and the second plate may include carbon reinforcement fiber or glass reinforcement fiber.

The main spacers and the sub spacers may include polymer resin.

The support member may further include a cushion layer.

In some embodiments of the present disclosure, a display device includes a window, a display panel below the window, and a support member below the display panel, and including a first plate, a second plate below the first plate, and a first spacer pattern between the first plate and the second plate, and including a plurality of main spacers contacting the first plate and the second plate, and a plurality of sub spacers each contacting only one of the first plate or the second plate.

The first spacer pattern may further include a second inner space defined between one of the main spacers and one of the sub spacers.

The display device may further include a first cushion layer between the display panel and the first plate.

The display device may further include a second cushion layer below the second plate.

In some embodiments of the present disclosure, a display device includes a display module including a first flat area exposed to an exterior of the display device in both a closed state and an open state, a curvature area extending from the first flat area, and having curvature in the closed state, and a second flat area extending from the curvature area, and facing the first flat area in the closed state, a support member below the display module, and including a first plate, a second plate below the first plate, and a first spacer pattern between the first plate and the second plate, and including a plurality of main spacers and a plurality of sub spacers, each of the main spacers being longer than each of the sub spacers, and a case configured to accommodate the display module and the support member, and configured to convert between the closed state and the open state by a sliding operation.

The main spacers may contact the first plate and the second plate, wherein the sub spacers contact the first plate or the second plate.

The support member may further include a second spacer pattern between the first plate and the second plate and including only main spacers, wherein the first spacer pattern overlaps at least one area of the curvature area, the first flat area, or the second flat area, and wherein the second spacer pattern overlaps reaming one or more areas of the curvature area, the first flat area, or the second flat area not overlapped by the first spacer pattern.

The case may include a first case coupled to the display module and the support member, and a second case coupled to the first case and configured to move away from or toward the first case.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings:

FIG. 2B is a perspective view of an open state of the display device illustrated in FIG. 2A;

DETAILED DESCRIPTION

Figure 1A:
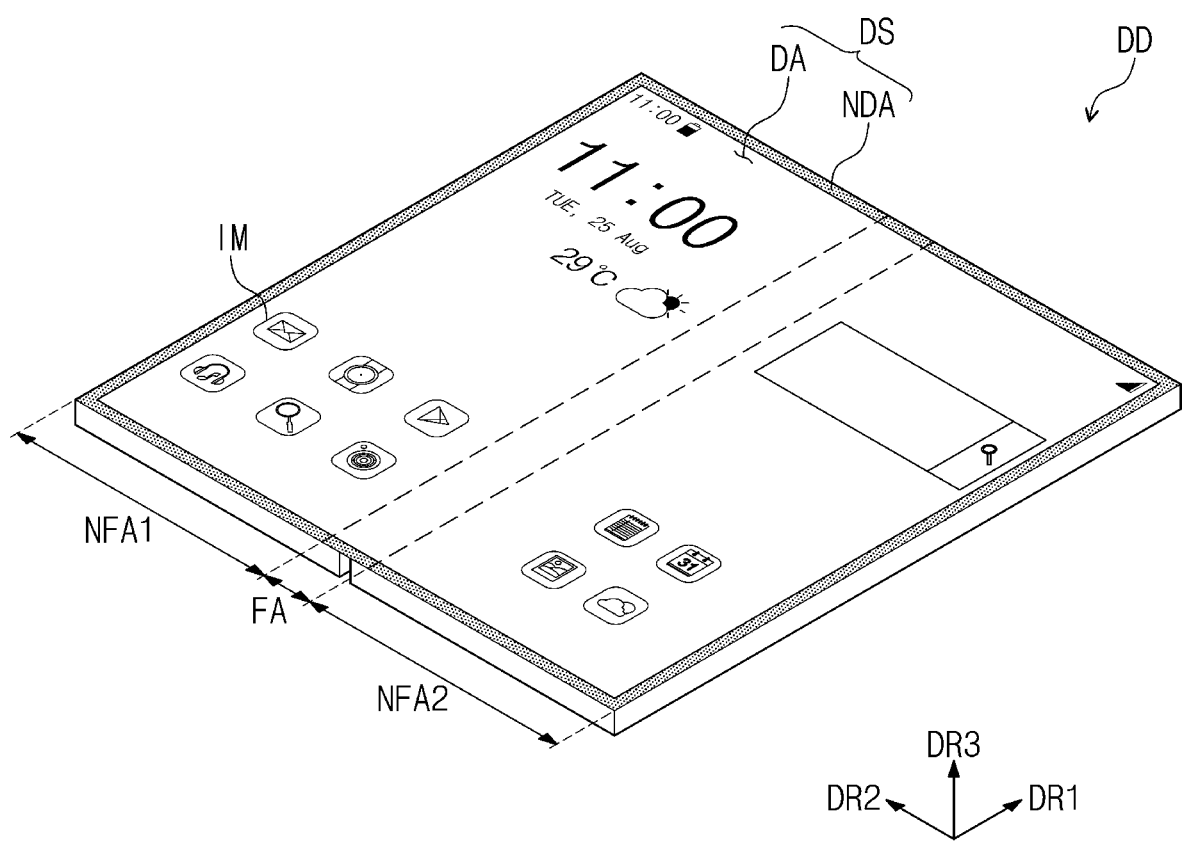
FIGS. 1A and 1B are perspective views of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
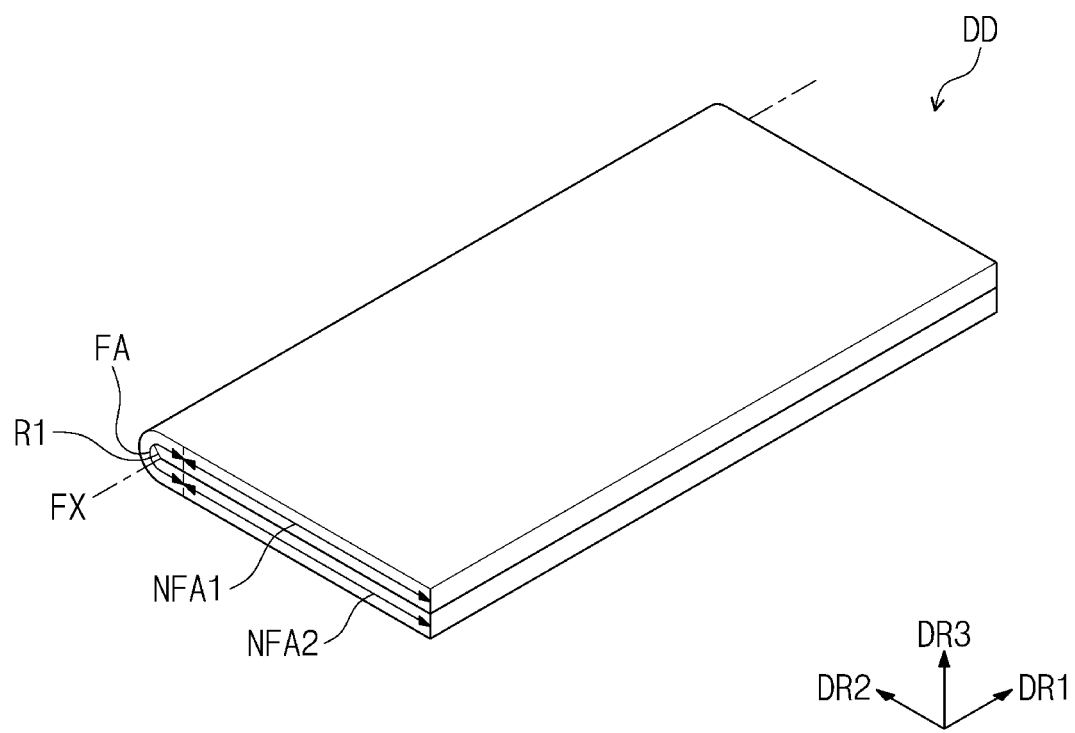

FIGS. 1A and 1B are perspective views of a display device DD according to some embodiments of the present disclosure. FIG. 1A illustrates an unfolded state, and FIG. 1B illustrates a folded state. The display device DD illustrated in FIGS. 1A and 1B may be a foldable display device.

In some embodiments, the display device DD may be a large electronic apparatus such as a television, a monitor, or an outdoor advertisement board. Also, the display device DD may be a small-to-medium electronic apparatus such as a personal computer, a laptop computer, a personal digital terminal, a vehicle navigation unit, a game console, a smart phone, a tablet, and a camera. Also, these apparatuses are merely provided as examples, and other electronic apparatuses may be employed as long as not departing from the present disclosure. In some embodiments, the display device DD is illustrated as a smart phone.

The display device DD may have a hexahedral shape having the thickness in a third direction DR3 on a plane defined by a first direction DR1 and a second direction DR2 that cross each other. However, this is merely an example, and the display device DD may have various shapes, and is not limited to any one embodiment.

Referring to FIGS. 1A and 1B, the display device DD according to some embodiments of the present disclosure may include a display surface DS defined by the first direction DR1, and the second direction DR2 crossing the first direction DR1. The display device DD may provide a user with an image IM through the display surface DS. The image IM may include static images as well as dynamic images. In FIG. 1A, a plurality of application icons, a watch, and the like are illustrated as one example of the image IM.

In FIG. 1A, the display surface DS is illustrated as being parallel to a surface defined by the first direction DR1, and the second direction DR2 crossing the first direction DR1. However, this is merely an example, and in other embodiments, a display surface DS of a display device DD may have a curved shape.

The normal direction of the display surface DS of the display device DD, that is, a direction in which the image IM is displayed, among the directions associated with the display device DD, is indicated as the third direction DR3. A front surface (or a top surface) and a rear surface (or a bottom surface) in each member may be distinguished by the third direction DR3. Hereinafter, the first to third directions DR1, DR2, and DR3 refer to the same reference symbols as the directions indicated by first to third directional axes, respectively.

The display surface DS may include a display area DA, and a non-display area NDA around the display area DA.

The display area DA may display the image IM, while the non-display area NDA might not display the image IM. The non-display area NDA may surround the display area DA. However, the present disclosure is not limited thereto, and the shape of the display area DA and the shape of the non-display area NDA may be changed. Also, the non-display area NDA might not be present on the front surface of the display device DD.

The display device DD may be flexible, meaning that it may have the characteristic of being bendable, and may encompass all structures from a completely foldable structure to a structure that is bendable to the order of several nanometers. For example, the display device DD may be a curved display device or a foldable display device.

In some embodiments, the display device DD may include a curvature area FA, a first flat area NFA1, and a second flat area NFA2. In the second direction DR2, the curvature area FA may be located between the first flat area NFA1 and the second flat area NFA2.

As illustrated in FIG. 1B, the curvature area FA may be folded about a folding axis FX that is substantially parallel to the first direction DR1. The curvature area FA may have curvature corresponding to a radius R1 of curvature (e.g., predetermined curvature and a predetermined radius of curvature). The display device DD may be in-folded, so that the first flat area NFA1 and the second flat area NFA2 face each other, and such that the display surface DS is not exposed to the outside.

In some embodiments of the present disclosure, the display device DD may be out-folded so that the display surface DS is exposed to the outside. In some embodiments of the present disclosure, the display device DD may be configured such that an in-folding operation or an out-folding operation are mutually possible, and such that each operation may be repeated with an unfolding operation. In some embodiments of the present disclosure, the display device DD may be configured such that the unfolding operation and the in-folding operation are repeatedly performed, or such that the unfolding operation and the out-folding operation are repeatedly performed.

As illustrated in FIG. 1B, a distance between the first flat area NFA1 and the second flat area NFA2 may be substantially the same as the radius R1 of curvature, but the present disclosure is not limited thereto. In some embodiments, the distance between the first flat area NFA1 and the second flat area NFA2 may be less than the radius of curvature R1.

Figure 2A:
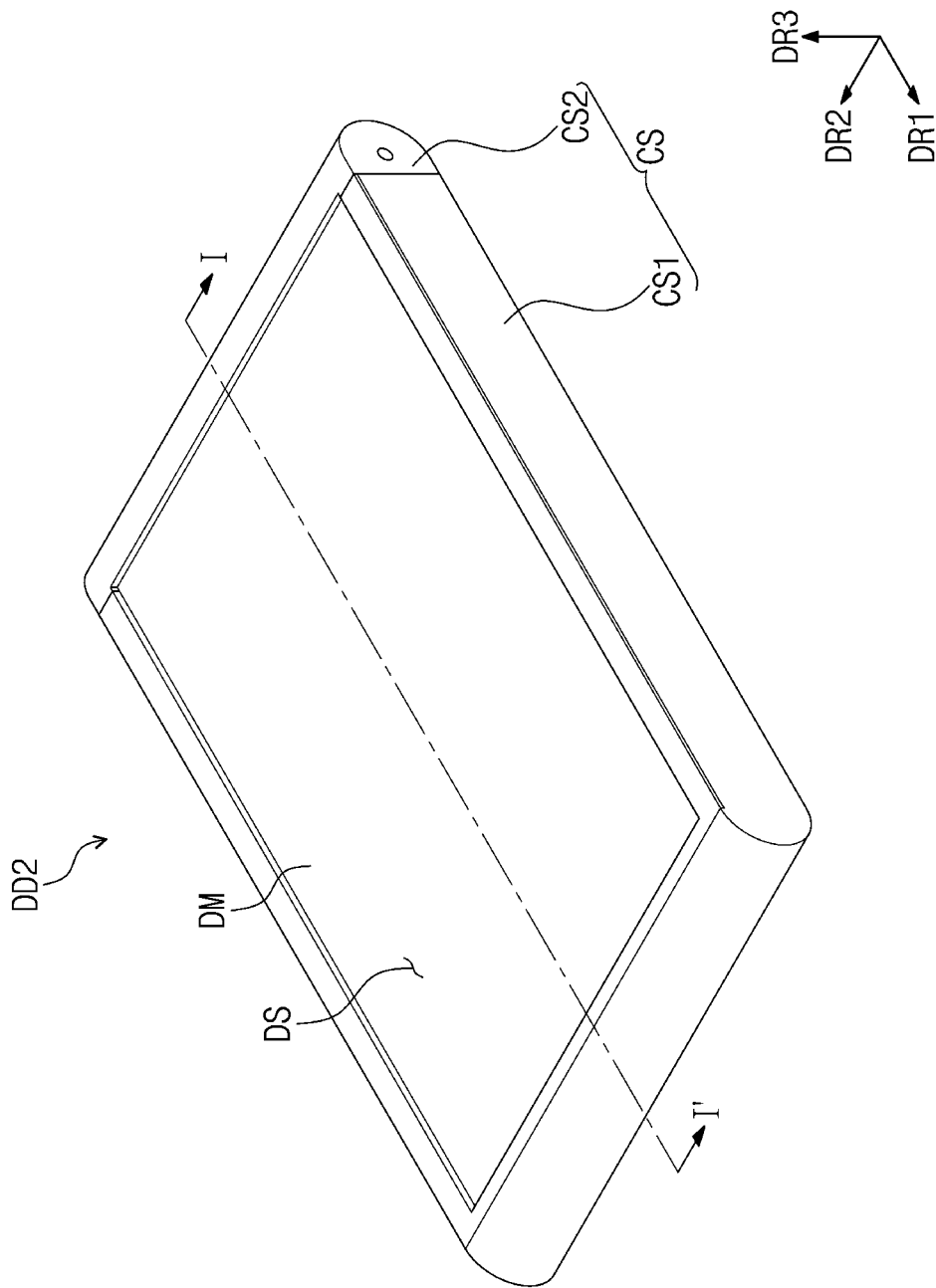
FIGS. 2A and 2B are perspective views of a display device according to other embodiments of the present disclosure.
Figure 2B:
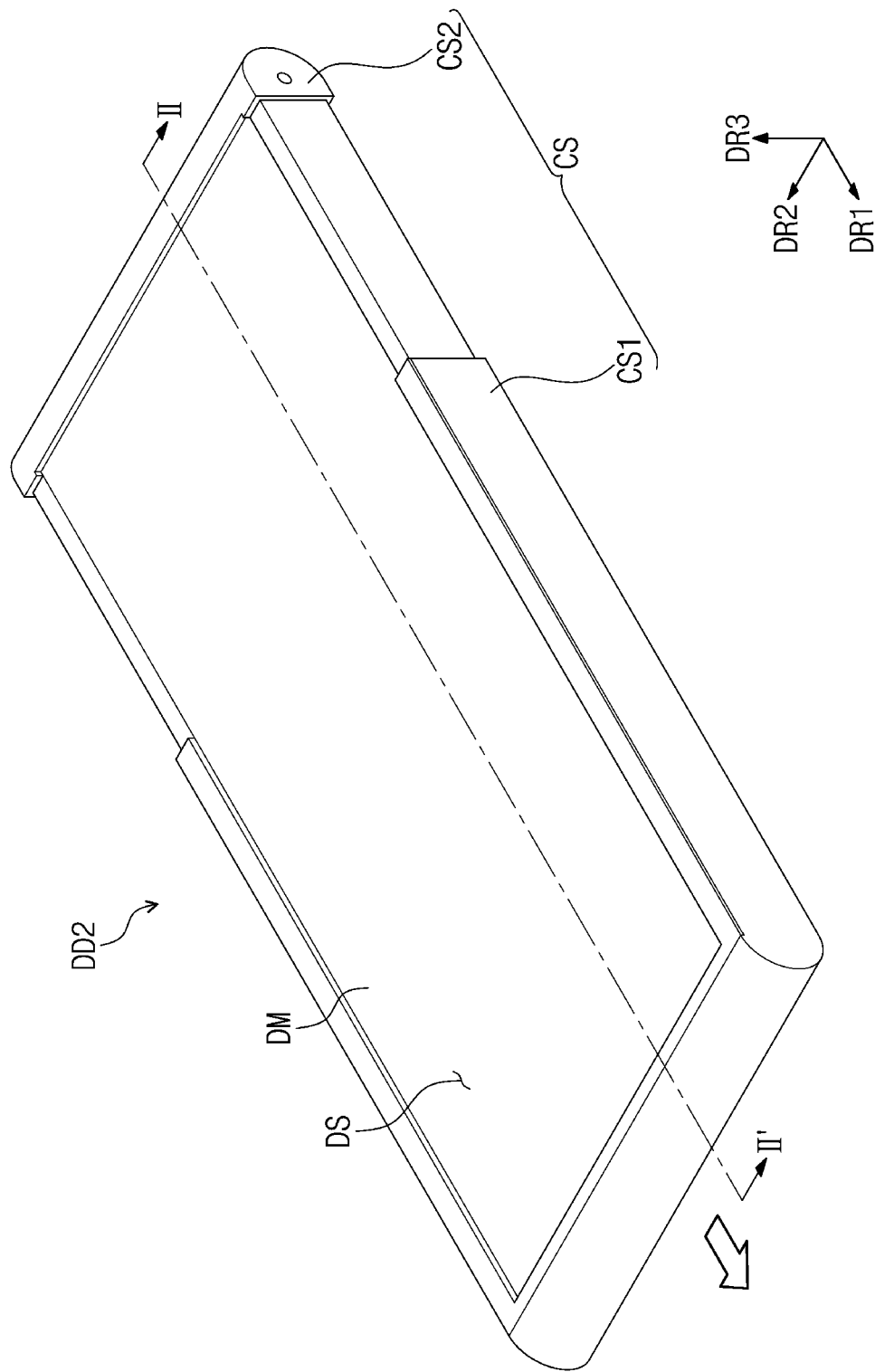
Figure 3A:
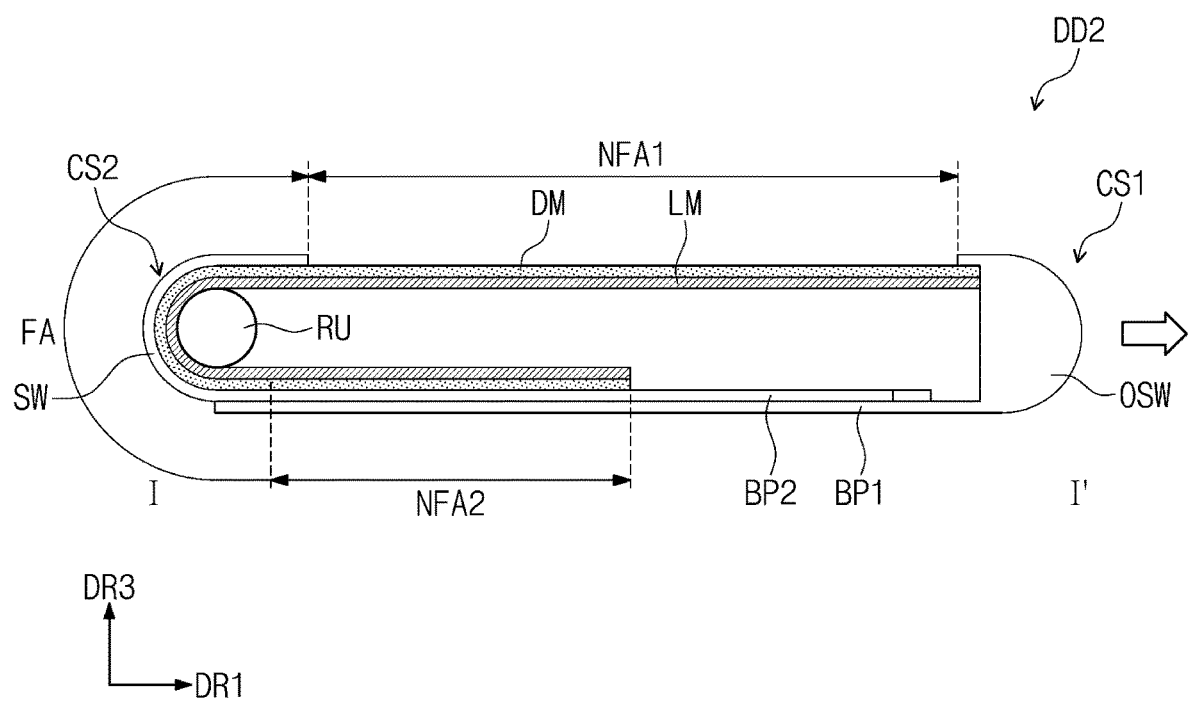
FIGS. 3A and 3B are cross-sectional views of a display device according to some embodiments of the present disclosure.
Figure 3B:
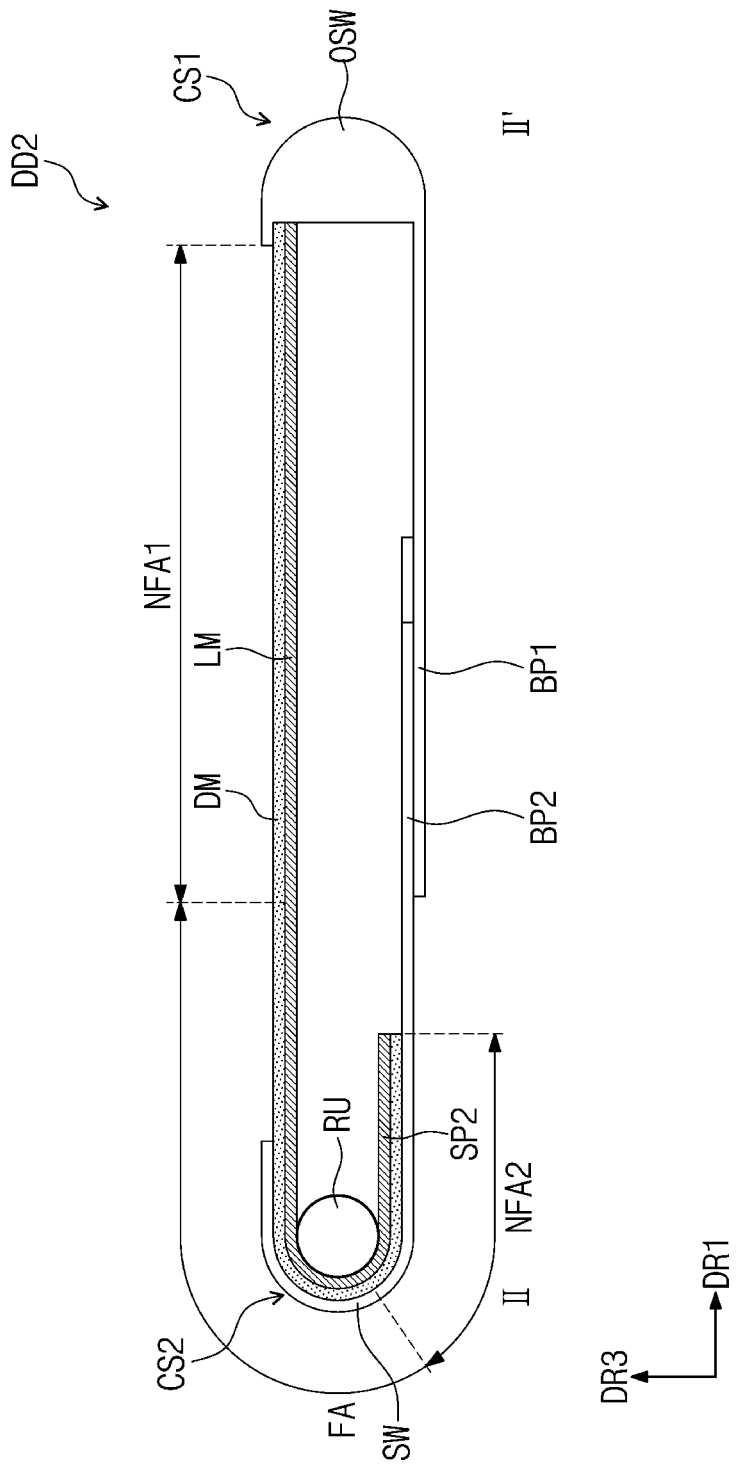

FIGS. 2A and 2B are perspective views of a display device DD2 according to other embodiments of the present disclosure. FIG. 2A is a perspective view of a closed state of a display device DD2, and FIG. 2B is a perspective view of an open state of the display device DD2 illustrated in FIG. 2A. FIGS. 3A and 3B are cross-sectional views of a display device DD2 according to some embodiments of the present disclosure. FIG. 3A is a cross-sectional view taken along the line I-I' of FIG. 2A. FIG. 3B is a cross-sectional view taken along the line II-II' of FIG. 2B. The display device DD2 illustrated in FIGS. 2A to 3B may be a slidable display device.

Referring to FIG. 2A, the display device DD2 according to other embodiments of the present disclosure may include a display module DM and a case CS that accommodates the display module DM. The display module DM may be exposed to the outside through an opening defined in an upper portion of the case CS.

The case CS includes a first case CS1 and a second case CS2. The first case CS1 and the second case CS2 may be coupled to each other to accommodate the display module DM. The first case CS1 may be coupled to the second case CS2 so as to move in, or opposite to, a first direction DR1. FIG. 2A illustrates a closed state before the first case CS1 of the display device DD2 moves.

FIG. 2B illustrates an open state after the first case CS1 of the display device DD2 moves in the first direction DR1. Referring to FIG. 2B, a display surface DS of the display module DM may be an exposed surface that is exposed through the opening of the case CS. Thus, the area of the display surface DS may be adjusted according to the movement of the first case CS1. For example, the display module DM may be a flexible display module, and may be supported by a support member LM (see FIG. 4) located below the display module DM. The support member LM (see FIG. 4) is connected to the first case CS1, and when the first case CS1 moves in the first direction DR1, the support member LM (see FIG. 4) may also move in the first direction DR1.

In some embodiments, a portion of the display module DM, which is not exposed to the outside, which is other than the display surface DS of the display module DM, and which is exposed through the opening, may be located inside the case CS. The size of the display surface DS may increase in the first direction DR1 as the first case CS1 moves. Also, the display module DM located on the support member LM may move together with the support member LM in the first direction DR1 as the first case CS1 moves, and thus the display surface DS of the display module DM may also be expanded. Thus, a user may view an image through a more expanded screen.

Hereinafter, as illustrated in FIGS. 2A and 3A, a state of the display device DD2, in which the display surface DS of the display module DM is set to be a basic size, may be defined as a closed state. As illustrated in FIGS. 2B and 3B, a state of the display device DD2, in which the display surface DS of the display module DM is expanded, may be defined as an open state.

In some embodiments, the open state and the closed state of the display device DD2 may be determined according to the sliding operation of the case CS. The closed state of the display device DD2 may correspond to a closed state of the case CS, and the open state of the display device DD2 may correspond to an open state of the case CS. The case CS may be converted from the closed state to the open state when the display surface DS of the display module DM is expanded as the first case CS1 moves in the first direction DR1. That is, the case CS may convert the display device DD2 from the closed state to the open state, or may convert the display device DD2 from the open state to the closed state.

Referring to FIGS. 3A and 3B, the display device DD2 includes a display module DM, a support member LM, and cases CS1 and CS2.

Referring to FIG. 3A, the display module DM according to some embodiments may include a first flat area NFA1, a curvature area FA, and a second flat area NFA2 with respect to the closed state. The first flat area NFA1 may be exposed to the outside in the closed state. The curvature area FA is extended from the first flat area NFA1 and is not exposed to the outside in the closed state. The second flat area NFA2 is extended from the curvature area FA and is not exposed to the outside in the closed state.

In some embodiments, the curvature area FA in the closed state may be folded about an axis that is substantially parallel to the second direction DR2. The curvature area FA may have curvature and a radius of curvature (e.g., predetermined curvature and a predetermined radius of curvature). The second flat area NFA2 may face the first flat area NFA1.

Referring to FIG. 3B, the first flat area NFA1 may be exposed to the outside even in the open state. All or a portion of the curvature area FA may be exposed to the outside in the open state. In some embodiments, all of the curvature area FA may be exposed to the outside in the open state. The second flat area NFA2 may be partially exposed to the outside in the open state, or might not be exposed to the outside even in the open state.

The support member LM may be located below the display module DM to support the display module DM. The support member LM may be located to overlap the entire area of the display module DM. The support member LM will be described in more detail through FIGS. 5A and 5B.

The case CS may accommodate the display module DM and the support member LM. The case CS includes a first case CS1 and a second case CS2. The second case CS2 may be coupled to the first case CS1, and may move in a direction away from, or toward, the first case CS1 with respect to a first direction DR1.

The display module DM and the support member LM may be coupled and fixed to the first case CS1. The repeated description of the case CS will be omitted. The case CS may convert the closed state and the open state of the display device DD2 through the sliding operation.

The first case CS1 may include a first side wall portion OSW and a first bottom portion BP1. The second case CS2 may include a second side wall portion SW and a second bottom portion BP2. In some embodiments, the display module DM and the support member LM may be fixed to the first side wall portion OSW of the first case CS1.

In some embodiments, the display device DD2 may include a rotary unit RU. The rotary unit RU may be located inside the second case CS2, and may be coupled to the second case CS2. For example, the rotary unit RU may be coupled to the second side wall portion SW of the second case CS2. The rotary unit RU may rotate while being coupled to the second side wall portion SW. The rotary unit RU may rotate according to the sliding operation of the case CS, and may expand or reduce the display surface DS/the effective size of the display surface DS (see FIGS. 3A and 3B).

Figure 4:
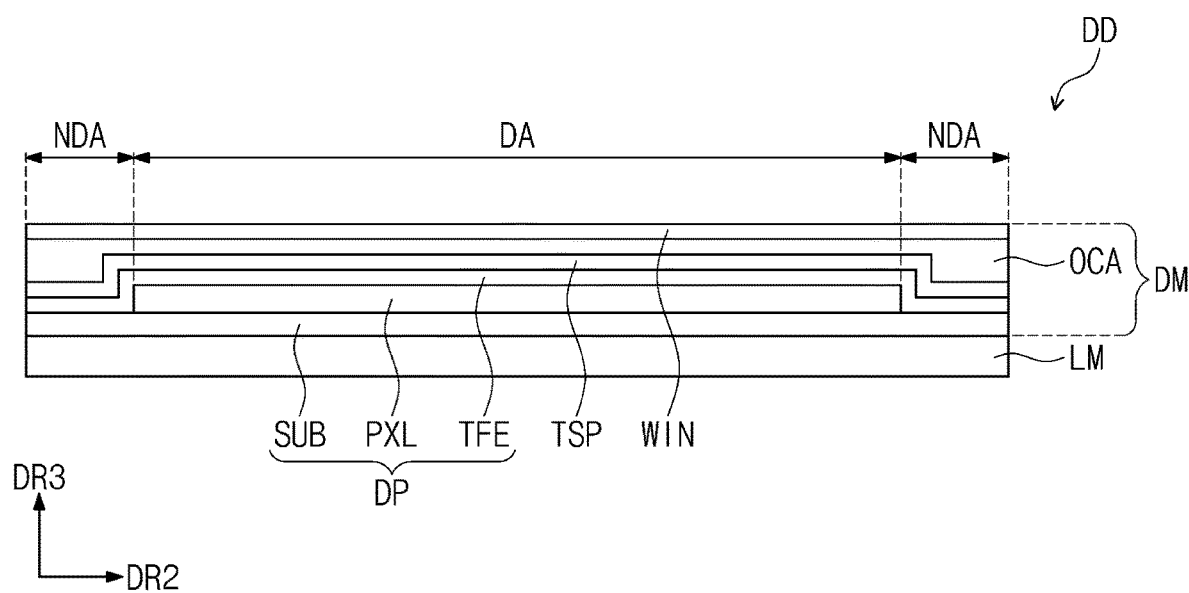
FIG. 4 is a cross-sectional view of a display device according to some embodiments.

FIG. 4 is a schematic cross-sectional view of the display device illustrated in FIGS. 1A to 3B.

Referring to FIG. 4, a display device DD may include a display module DM, and a support member LM located below the display module DM. The support member LM may support the display module DM that is a component located thereon. The support member LM may be located to overlap the entire area of the display module DM.

The display module DM may include a display panel DP, a touch sensing part TSP located on the display panel DP, a window WIN located on the touch sensing part TSP, and an adhesive layer OCA located between the touch sensing part TSP and the window WIN. An adhesive layer may be further located between the above-described members as necessary.

The display panel DP may be an organic light emitting display panel. However, the present disclosure is not limited thereto, and various display panels capable of displaying an image, such as a liquid crystal display panel, an electro wetting display panel, and an electrophoretic display panel may be used as the display panel DP. The display panel DP may be a flexible display panel.

The display panel DP may include a substrate SUB, a pixel layer PXL located on the substrate SUB, and a thin film encapsulation layer TFE located above the substrate SUB to cover the pixel layer PXL, which are stacked in this order in the third direction DR3.

The substrate SUB may include a display area DA and a non-display area NDA around the display area DA. The substrate SUB may include a flexible plastic substrate as a transparent substrate. The substrate SUB may be a polymer substrate, a plastic substrate, a glass substrate, a metal substrate, or a composite material substrate, or the like. For example, the substrate SUB may include polyimide-based resin. However, the material included in the substrate SUB is not limited to the examples described above.

The pixel layer PXL may be located in an area corresponding to the display area DA. The pixel layer PXL may include a plurality of pixels. The plurality of pixels may be spaced apart from each other within the display area DA. The plurality of pixels may output light having color information in response to electrical signals, and thus the image IM may be displayed on the display area DA.

Each of the plurality of pixels may include a light emitting element. The light emitting element may be an organic light emitting diode (OLED) element, a micro light emitting diode (micro LED) element, or a nano light emitting diode (nano LED) element, but the present disclosure is not limited thereto.

The thin film encapsulation layer TFE may be located on the pixel layer PXL to encapsulate the light emitting elements. The encapsulation layer TFE may play roles in protecting the pixel layer PXL from moisture/oxygen, and protecting the pixel layer PXL from impurities, such as dust particles.

The thin film encapsulation layer TFE may include at least one of an organic film or an inorganic film, or may include an organic film and an inorganic film. The thin film encapsulation layer TFE may have a structure in which an organic film and an inorganic film are alternately and repeatedly stacked.

The touch sensing part TSP may be located on the thin film encapsulation layer TFE. The touch sensing part TSP may sense an external input (e.g., a hand of a user, a touch pen, or the like) and may change the external input into an input signal (e.g., a predetermined input signal). The touch sensing part TSP may include a plurality of sensing electrodes for sensing an external input. The sensing electrodes may sense the external input through a capacitive method.

The touch sensing part TSP may be manufactured directly on the thin film encapsulation layer TFE when the display module DM is manufactured. However, the present disclosure is not limited thereto, and the touch sensing part TSP may be manufactured in the form of a touch panel that is independent of the display panel DP, and that is attached to the display panel DP through an adhesive.

The window WIN may protect the display panel DP and the touch sensing part TSP from external scratches and impacts. The window WIN may be attached to the touch sensing part TSP by the adhesive layer OCA. The adhesive layer OCA may include an optical clear adhesive. The image generated in the display panel DP passes through the window WIN, and then may be provided to the user.

Figure 5A:
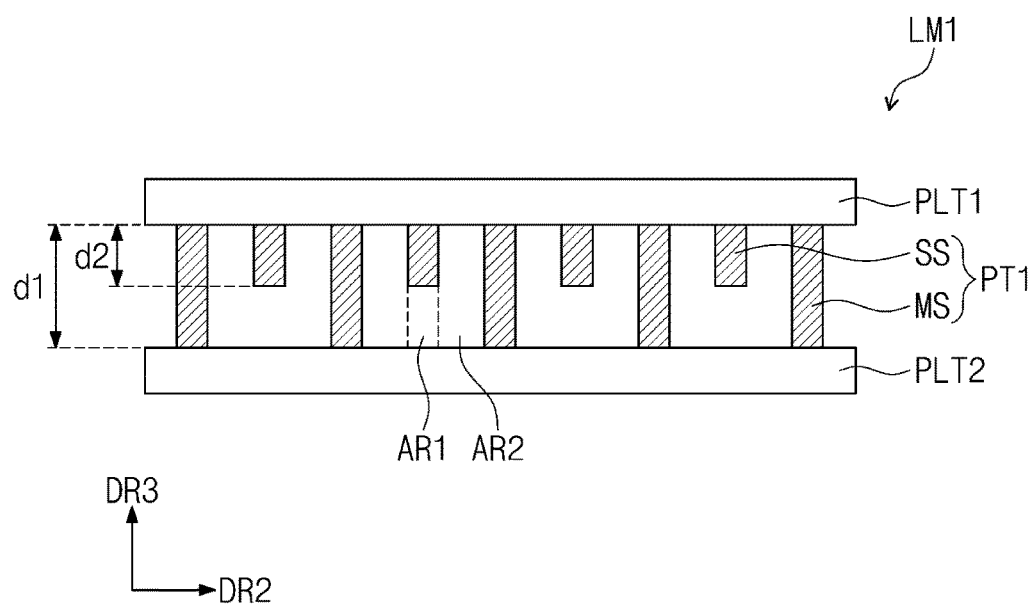
FIGS. 5A and 5B are cross-sectional views of support members according to some embodiments.
Figure 5B:
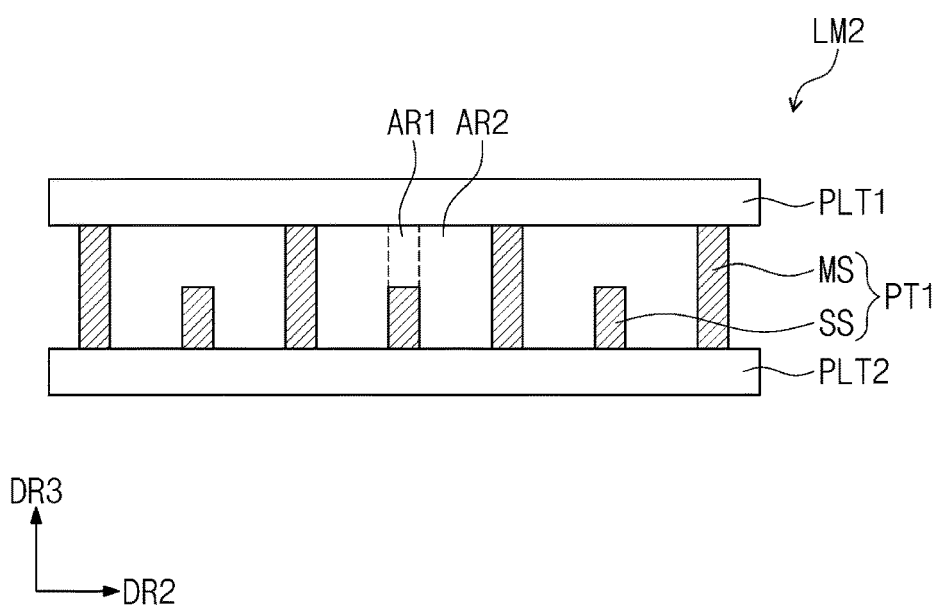

FIGS. 5A and 5B are cross-sectional views of support members LM1 and LM2 according to some embodiments.

Referring to FIG. 5A, in some embodiments, a support member LM1 may include a first plate PLT1, a second plate PLT2, and a first spacer pattern PT1. The first spacer pattern PT1 is located between the first plate PLT1 and the second plate PLT2, and includes a plurality of main spacers MS and a plurality of sub spacers SS. In the first spacer pattern PT1, the main spacers MS and the sub spacers SS may be spaced apart from each other in a second direction DR2. For example, each of the main spacers MS and each of the sub spacers SS may be alternately and repeatedly arranged. However, the present disclosure is not limited thereto, and the arrangement order thereof may be changed.

The first plate PLT1 and the second plate PLT2 may be spaced apart from each other in a third direction DR3. In some embodiments, the first plate PLT1 may be closer to the display module DM (see FIG. 6) than the second plate PLT2 is.

In the support member LM1 according to some embodiments, as the first plate PLT1 and the second plate PLT2 are spaced apart from each other in the third direction DR3, inner spaces AR1 and AR2 may be defined, which will be described later. The support member LM1 having the inner spaces AR1 and AR2 according to some embodiments may have a lower modulus of elasticity than a support member having an integrated structure in which a first plate PLT1 and a second plate PLT2 are coupled without inner spaces AR1 and AR2. Thus, stress generated due to various folding and sliding operations may be reduced in the support member LM1 according to some embodiments disclosed herein.

In some embodiments, each of the first plate PLT1 and the second plate PLT2 may include fiber-reinforced plastic. For example, the first plate PLT1 and the second plate PLT2 may include carbon reinforcement fiber and/or glass reinforcement fiber. However, the present disclosure is not limited thereto, and each of the first plate PLT1 and the second plate PLT2 may include metal. Each of the first plate PLT1 and the second plate PLT2 may include a single metal material or an alloy of a plurality of metal materials.

The main spacer MS may have a length that is different from that of the sub spacer SS. For example, a length d1 of each of the plurality of main spacers MS may be greater than a length d2 of each of the plurality of sub spacers SS (d1>d2). Here, the length in the present disclosure may be defined as a length measured in a third direction DR3 on the plane defined by the second direction DR2 and the third direction DR3.

In some embodiments, the plurality of main spacers MS and the plurality of sub spacers SS in the first spacer pattern PT1 may be alternately and repeatedly arranged one by one along the second direction DR2. That is, in the second direction DR2, the main spacer MS and the sub spacer SS are arranged, and then repeatedly, the main spacer MS and the sub spacer SS may be arranged. However, the present disclosure is not limited thereto, and various arrangements are possible as suitable. The main spacers MS are repeatedly arranged with a respective sub spacer SS located therebetween. Also, the sub spacers SS are repeatedly arranged with a respective main spacer MS located therebetween. The interval between the main spacer MS and the sub spacer SS is not particularly limited, and may be adjusted according to the size, position, material, and the like.

Each of the main spacers MS and each of the sub spacers SS are spaced apart from each other in the second direction DR2, and thus a second inner space AR2 may be defined between a main spacer MS and a sub spacer SS adjacent thereto. In some embodiments of the present disclosure, the inner spaces AR1 and AR2 may represent spaces in which the main spacers MS and the sub spacers SS are not present between the first plate PLT1 and the second plate PLT2, and the inner spaces AR1 and AR2 may be in a vacuum state or filled with air.

In some embodiments, the main spacer MS may be in contact with both the first plate PLT1 and the second plate PLT2. That is, the length d1 of the main spacer MS may be equal to the distance between the first plate PLT1 and the second plate PLT2. The support members LM1 and LM2 according to some embodiments include the main spacer MS having the length equal to the distance between the first plate PLT1 and the second plate PLT2, and thus may exhibit improved shear stress and may have a lighter weight than existing support members made of only an integrated plate. Thus, a display device DD includes the support members LM1 and LM2 according to some embodiments, and thus may be reduced in weight while maintaining or enhancing durability.

In some embodiments, the sub spacer SS may be in contact with only one of the first plate PLT1 or the second plate PLT2. That is, the length d2 of the sub spacer SS may be less than the distance between the first plate PLT1 and the second plate PLT2. Referring to FIG. 5A, the sub spacer SS may be in contact with the first plate PLT1 while not being in contact with the second plate PLT2. Here, the first inner space AR1 may be defined between the sub spacer SS and the second plate PLT2. Referring to FIG. 5B, the sub spacer SS may be in contact with the second plate PLT2 while not being in contact with the first plate PLT1. Here, the first inner space AR1 may be defined between the sub spacer SS and the first plate PLT1.

The support members LM1 and LM2 according to some embodiments of the present disclosure may have improved strain through the first inner space AR1 defined between the first plate PLT1 and the second plate PLT2. Thus, the display device DD includes the support members LM1 and LM2 according to some embodiments, and thus may have improved reliability during the folding or sliding operation. The length d2 of the sub spacer SS is not particularly limited as long as it is less than the length d1 of the main spacer MS, and the sub spacer SS may be adjusted according to the size, position, material, and the like of the various elements.

In some embodiments, each of the main spacer MS and the sub spacer SS may include polymer resin. A method for forming the main spacer MS and the sub spacer SS is not particularly limited, and the main spacer MS and the sub spacer SS may be formed through, for example, a photolithography method.

Figure 6:
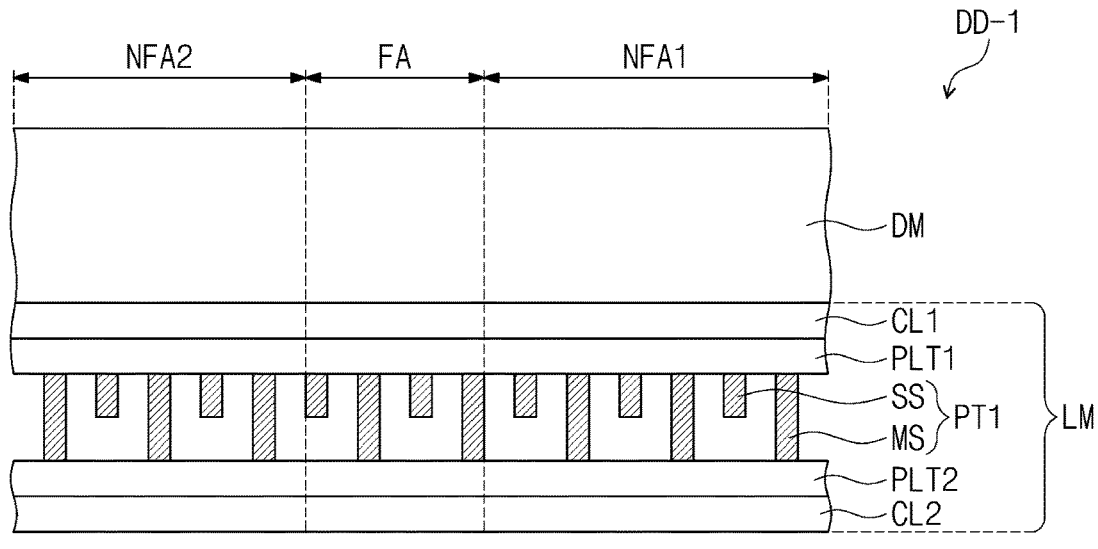
FIGS. 6 to 8 are cross-sectional views of display devices according to some embodiments.
Figure 7:
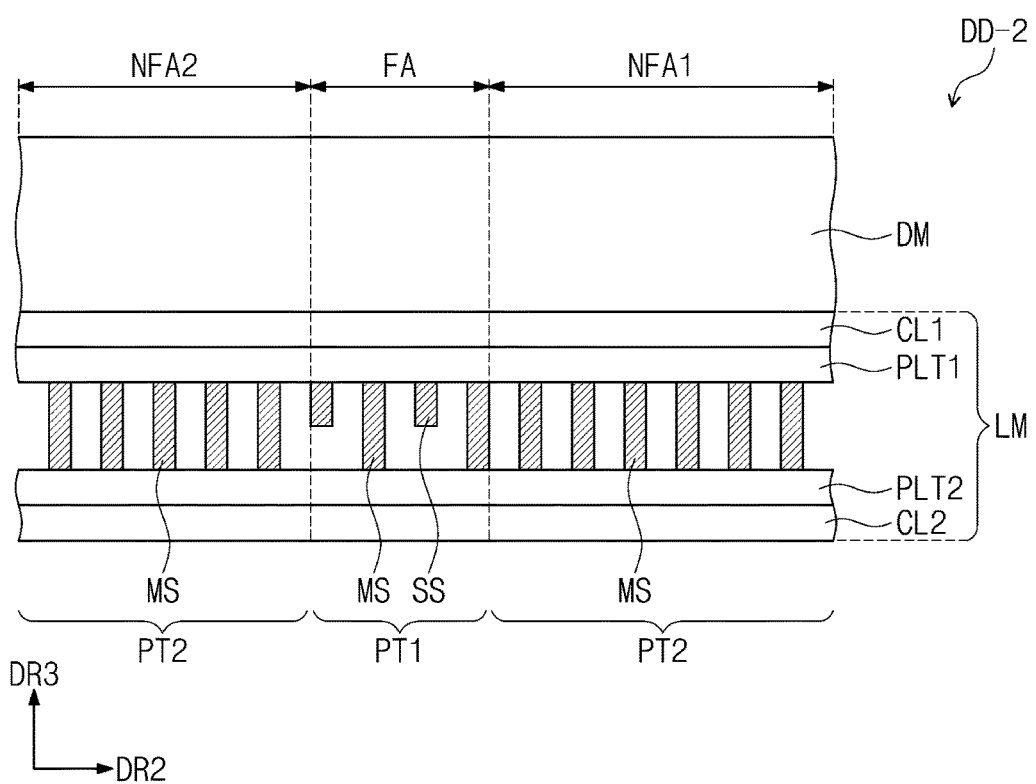
Figure 8:
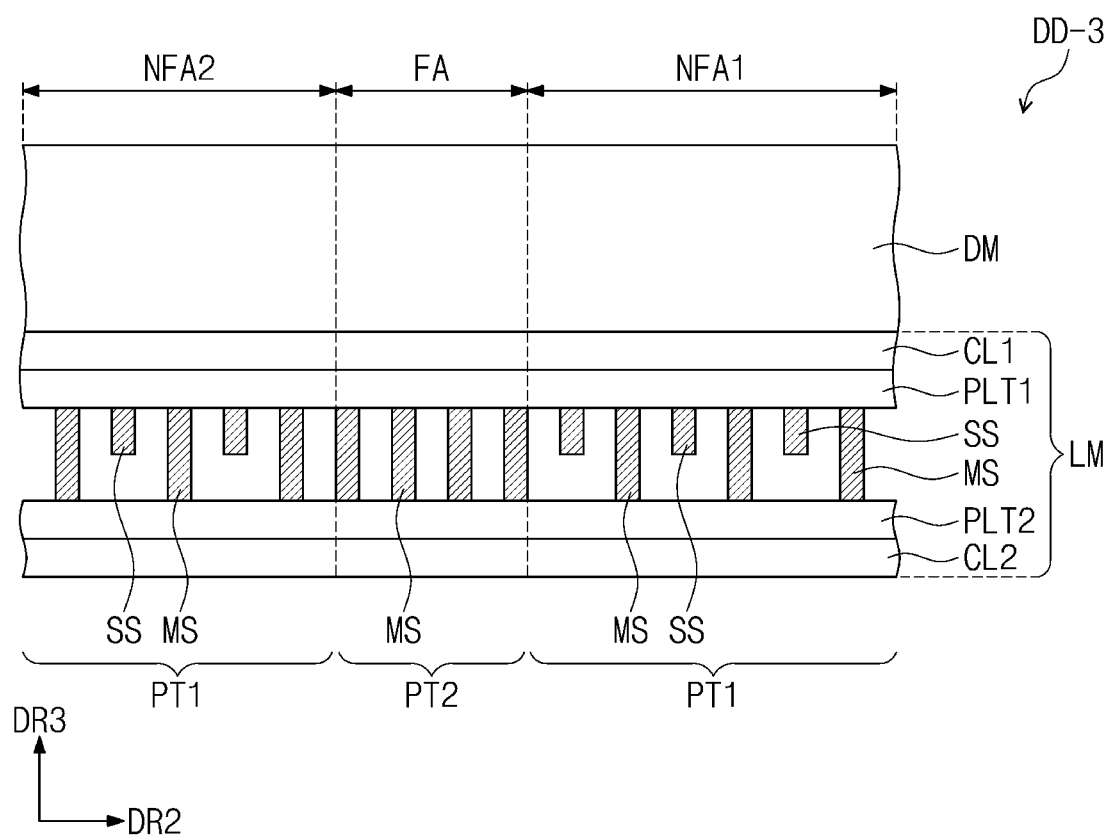

FIGS. 6, 7, and 8 are respectively cross-sectional views of display devices DD-1, DD-2, and DD-3 according to some embodiments.

In some embodiments, a support member LM may further include cushion layers CL1 and CL2. In some embodiments, a first cushion layer CL1 may be located below a display module DM and above a first plate PLT1. A second cushion layer CL2 may be located below a second plate PLT2. However, the present disclosure is not limited thereto. The support member LM might not include some or all of the cushion layers, or may further include an additional cushion layer as suitable. Also, although not illustrated, an adhesive layer may be located between each layers, for example, between the first cushion layer CL1 and the first plate PLT1 and/or between the second plate PLT2 and the second cushion layer CL2.

The cushion layers CL1 and CL2 may absorb external impacts applied to the display module DM to thus reduce or prevent likelihood of damage to the display module DM. Each of the cushion layers CL1 and CL2 is a layer having an elastic force (e.g., a predetermined elastic force), and may include foamable resin, sponge, and/or polyurethane. In some embodiments, the first cushion layer CL1 may have a color so that components located below the first cushion layer CL1 are not visible to a user when the display device DD (see FIG. 4) is viewed from above the window WIN (see FIG. 4). The first cushion layer CL1 may include a light absorbing material.

Also, in other embodiments, the support member LM may further include, as suitable, a light blocking layer for blocking light incident to the display panel DP, and/or a heat dissipating layer for dissipating heat generated from the display panel DP.

In some embodiments, a first spacer pattern PT1 may be located over all areas of each of the display devices DD-1, DD-2, and DD-3, or may be located on only some areas thereof. Referring to FIG. 6, the first spacer pattern PT1 may be located over all areas of, or an entirety of, the display device DD-1. For example, the display device DD-1 may include a curvature area FA, a first flat area NFA1, and a second flat area NFA2, and the first spacer pattern PT1 may be located to overlap all of the curvature area FA, the first flat area NFA1, and the second flat area NFA2.

Referring to FIGS. 7 and 8, a support member LM may further include a second spacer pattern PT2 located between the first plate PLT1 and the second plate PLT2. The second spacer pattern PT2 may include only a plurality of main spacers MS while not including any sub spacer SS.

In the second spacer pattern PT2, the plurality of main spacers MS may be spaced apart from each other in a second direction DR2. The second spacer pattern PT2 does not include the sub spacer SS, and thus the first inner space AR1 shown in FIGS. 5A and 5B may not be defined or may not be included. Accordingly, the area of the display device including the second spacer pattern PT2 may have a higher modulus of elasticity than the area of the display device including the first spacer pattern PT1, and thus may have reduced strain but enhanced durability.

In the display devices DD-2 and DD-3 according to some embodiments, a first spacer pattern PT1 may be located only on some areas of the display devices DD-2 and DD-3. In this case, the second spacer pattern PT2 may be located on the remaining areas.

Referring to FIG. 7, in the display device DD-2 according to some embodiments, the first spacer pattern PT1 may be located overlapping a curvature area FA of a display module DM, and the second spacer pattern PT2 may be located overlapping a first flat area NFA1 and a second flat area NFA2 of the display module DM. The display device DD-2 according to some embodiments may have relatively high durability in the first flat area NFA1 and in the second flat area NFA2, and may have relatively improved strain in the curvature area FA.

Referring to FIG. 8, in the display device DD-3 according to other embodiments, the second spacer pattern PT2 may overlap a curvature area FA of a display module DM, and the first spacer pattern PT1 may overlap a first flat area NFA1 and a second flat area NFA2 of the display module DM. The display device DD-3 according to some embodiments may have relatively improved strain in the first flat area NFA1 and the second flat area NFA2, and may have relatively high durability in the curvature area FA.

In addition, in other embodiments, the first spacer pattern PT1 may be located overlapping the curvature area FA and the first flat area NFA1, and the second spacer pattern PT2 may be located overlapping the second flat area NFA2. Alternatively, the first spacer pattern PT1 may be located overlapping the curvature area FA and the second flat area NFA2, and the second spacer pattern PT2 may be located overlapping the first flat area NFA1. However, the present disclosure is not limited thereto. As may be suitable, the first spacer pattern PT1 may be located overlapping only some areas of each of the curvature area FA, the first flat area NFA1, and the second flat area NFA2, and the second spacer pattern PT2 may be located overlapping the remaining areas thereof.

The display device according to some embodiments includes the support member that includes the spacers having different lengths, thereby exhibiting improved strain while maintaining durability as compared to the related art.

The display device according to some embodiments includes the support member, which includes the separable plates and two types of the spacers having different lengths, thereby exhibiting excellent durability and improved strain.

The display device according to some embodiments includes the support member which has the inner space to reduce stress when diversely folding and/or sliding, thereby exhibiting the excellent reliability.

Although described with reference to the embodiments of the present disclosure, it will be understood that various changes and modifications of the present disclosure may be made by one skilled in the art or one having ordinary knowledge in the art without departing from the spirit and technical field of the present disclosure as hereinafter claimed.

Hence, the scope of the present disclosure is to be determined in accordance with the following claims, with functional equivalents thereof to be included therein, and should not be limited by the foregoing description.

What is claimed is:

1. A display device comprising:
   a display module comprising a window, and a display panel below the window, the display module having:
   a curvature area configured to be folded about an axis parallel to a first direction; a first flat area; and
   a second flat area spaced from the first flat area in a second direction crossing the first direction with the curvature area therebetween; and a support member below the display panel of the display module, and comprising:
   a first plate;
   a second plate below the first plate; and
   a first spacer pattern between the first plate and the second plate, and comprising a plurality of main spacers and a plurality of sub spacers, each of the main spacers being longer than each of the sub spacers;
   wherein the main spacers and the sub spacers are alternately arranged in the second direction.

2. The display device of claim 1, wherein the main spacers and the sub spacers are spaced apart from each other in the second direction.

3. The display device of claim 1, wherein the main spacers contact the first plate and the second plate, and
   wherein the sub spacers contact only one of the first plate or the second plate.

4. The display device of claim 1, wherein one of the sub spacers contacts the first plate, and
   wherein a first inner space is defined between the one of the sub spacers and the second plate.

5. The display device of claim 1, wherein one of the sub spacers contacts the second plate, and
   wherein a first inner space is defined between the one of the sub spacers and the first plate.

6. The display device of claim 1, wherein the support member further comprises a second spacer pattern between the first plate and the second plate, and comprising only main spacers.

7. The display device of claim 6, wherein the first spacer pattern overlaps the first flat area and the second flat area, and wherein the second spacer pattern overlaps the curvature area.

8. The display device of claim 6, wherein the first spacer pattern overlaps the curvature area, and
wherein the second spacer pattern overlaps the first flat area and the second flat area.

9. The display device of claim 1, wherein the first plate and the second plate comprise carbon reinforcement fiber or glass reinforcement fiber.

10. The display device of claim 1, wherein the main spacers and the sub spacers comprise polymer resin.

11. The display device of claim 1, wherein the support member further comprises a cushion layer.

12. A display device comprising:
a display module comprising:
a first flat area exposed to an exterior of the display device in both a closed state and an open state;
a curvature area extending from the first flat area, and having curvature in the closed state; and
a second flat area extending from the curvature area, and facing the first flat area in the closed state;
a support member below the display module, and comprising:
a first plate;
a second plate below the first plate; and
a first spacer pattern between the first plate and the second plate, and comprising a plurality of main spacers and a plurality of sub spacers, each of the main spacers being longer than each of the sub spacers; and
a case configured to accommodate the display module and the support member, and configured to convert between the closed state and the open state by a sliding operation.

13. The display device of claim 12, wherein the main spacers contact the first plate and the second plate, and
wherein the sub spacers contact the first plate or the second plate.

14. The display device of claim 12, wherein the support member further comprises a second spacer pattern between the first plate and the second plate and comprising only main spacers,
wherein the first spacer pattern overlaps at least one area of the curvature area, the first flat area, or the second flat area, and
wherein the second spacer pattern overlaps reaming one or more areas of the curvature area, the first flat area, or the second flat area not overlapped by the first spacer pattern.

15. The display device of claim 12, wherein the case comprises a first case coupled to the display module and the support member, and a second case coupled to the first case and configured to move away from or toward the first case.

* * * * *